United States Patent [19]

Miranda

[11] Patent Number: 5,279,316

[45] Date of Patent: Jan. 18, 1994

[54] MULTIPROCESSING SONIC BATH SYSTEM FOR SEMICONDUCTOR WAFERS

[75] Inventor: Henry R. Miranda, Milpitas, Calif.

[73] Assignee: P.C.T. Systems, Inc., Fremont, Calif.

[21] Appl. No.: 931,747

[22] Filed: Aug. 18, 1992

[51] Int. Cl.⁵ .............................................. B08B 3/12
[52] U.S. Cl. ..................................... 134/102.1; 134/1;
134/186; 134/902
[58] Field of Search ............... 134/1, 102.1, 184, 186, 134/902

[56] References Cited

U.S. PATENT DOCUMENTS 3,873,071 3/1975 Tatebe ............................ 134/184 X
5,071,488 12/1991 Takayama et al. ............. 134/902 X

FOREIGN PATENT DOCUMENTS 3220404 12/1983 Fed. Rep. of Germany .......... 134/1
189127 7/1989 Japan ................................... 134/902
281625 11/1990 Japan ..................................... 134/1
124027 5/1991 Japan ................................... 134/902
49619 2/1992 Japan ................................... 134/902
1456140 11/1976 United Kingdom ................ 134/184

*Primary Examiner*—Philip R. Coe
*Attorney, Agent, or Firm*—Townsend and Townsend Khourie and Crew

[57] ABSTRACT

A bath system for processing semiconductor wafers includes a container having walls with a sonic transducer mounted on the outside of one side wall which is oblique to the other side walls. The thickness of the one side wall permits sonic energy to pass therethrough to wafers held in a liquid bath. Liquid and gas are introduced into the housing from the bottom wall.

7 Claims, 3 Drawing Sheets

MULTIPROCESSING SONIC BATH SYSTEM FOR SEMICONDUCTOR WAFERS

BACKGROUND OF THE INVENTION

The present invention is related to the field of bath systems for processing semiconductor wafers and, more particularly, bath systems using sonic energy for processing such wafers.

In the present bath systems, a container is loaded with a cassette of semiconductor wafers and a processing liquid is pumped and filtered for recirculation through the container. Typically in a semiconductor fabrication area, there are several bath systems, each of which contains different liquids for processing the semiconductor wafers. The different liquids may include water with varying degrees of chemical contamination for sequentially rinsing the wafers after a processing step. One such bath system, for example, is disclosed in U.S. Pat. No. 4,955,402, which issued on Sep. 11, 1990 to the present inventor.

Associated with these bath systems are the costs for purchasing several systems for each fabrication area, and the costs of the processing liquids for the bath systems. There are also the cost associated with the handling of the wafers as they are moved from one bath to another, i.e., the time consumed in moving the wafers and the losses which inevitably occur in handling the wafers.

One proposal to overcome these deficiencies has been a multiple processing bath system. In such systems, the wafers are left in the bath container as the chemistry of the liquid is changed. Gas is bubbled through the liquid in the container to change the chemistry of the liquid.

Another recent development in semiconductor bath systems is the use of sonic energy which is directed against the wafers in the processing liquid. The sonic energy has been found to not only deliver kinetic energy for mechanically "scrubbing" the surfaces of the wafers, but also helps with the desired chemical reaction at the wafer surface/processing liquid interface.

However, bath systems using such sonic energy have not had optimal performance. In some systems, the sonic transducers have been mounted on the outside of the processing container with inefficient and uneven delivery of sonic energy to the wafers. To counter this problem, other systems have placed the sonic transducers on the inside of the processing container thereby exposing the transducers and their electrical connections to the sometimes corrosive properties of the processing liquid. This has sometimes lead to the contamination of the wafers. Furthermore, such systems have not been able to operate at higher temperatures from the failure of the bonding used to mount the transducers at those temperatures.

To overcome these problems, the present invention provides a unique system capable of multiple processing of semiconductor wafers with sonic energy which is delivered in an efficient and non-contaminating manner. Wafer handling is substantially reduced with the attendant savings of a single bath system.

SUMMARY OF THE INVENTION

The present invention provides for a bath system for processing semiconductor wafers which has a container for receiving at least one semiconductor wafer and for holding liquid for processing the wafer. The container has side walls and a bottom wall with at least one of the side walls oblique to the remaining side walls. Sonic transducers are attached to the oblique wall and inlets for liquid and gas mounted on the bottom wall so that liquid and gas may be introduced into the container from the bottom and sonic energy may directed from the side toward the wafer during processing.

The transducers are bonded to the outside of the container by epoxy having properties, when set, to effectively transmit sonic energy and to match the expansion of the transducers and wall over the range of processing temperatures.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENT(S)

Figure 1:
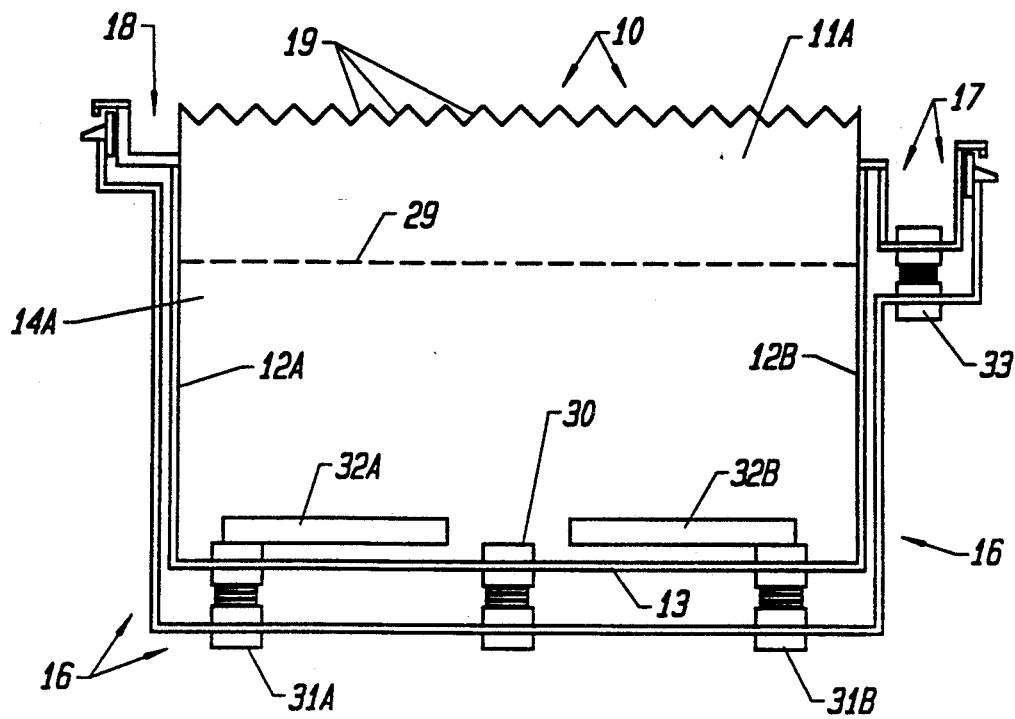
FIG. 1 is a cross-sectional front view of a bath system according to one embodiment of the present invention.

FIG. 1 is a cross-sectional representational front view of a bath system according to one embodiment of the present. Neither FIG. 1 nor any of the other figures in the drawings are drawn precisely to scale. However, these drawings illustrate the points of the present invention.

FIG. 1 shows a processing container 10 made of quartz which is mounted inside an outer container 16, which is typically made of plastic. The container 10 is open at the top with the top edges 19 of the container in a zig-zag or scalloped pattern. Around the patterned top edges 19 of the container 10 is a trough 18 which runs around all four sides of the container 10. The trough 18 leads to a small outlet container 17 which is located below the level of the trough 18. At the bottom of the outlet container 17 is an outlet 33. As in present bath systems, the trough 18 catches the overflow of the processing liquid over the patterned top edges 19 to fill the outlet container 17. The liquid in the container 17 is pumped through the outlet 33.

To introduce liquid, the container has an inlet 30 through which liquid is pumped. A sparger such as disclosed in the patent noted above may be used over the inlet 30. The container 10 also has two gas inlets 31A and 31B, each of which has gas dispersion manifolds 32A and 32B. Gas is introduced into the liquid filling the container 10 through the manifolds 32A and 32B. For ease of maintenance, the manifolds 32A and 32B are removable from the inlets 31A and 31B respectively by a threaded compression Teflon (a registered trademark of the Dupont Company of Wilmington, Del.) fitting such as a screw-on compression type fitting. From the manifolds 32A and 32B, gas is bubbled through the liquid to change the chemical nature of the liquid by gas transfer.

Figure 2:
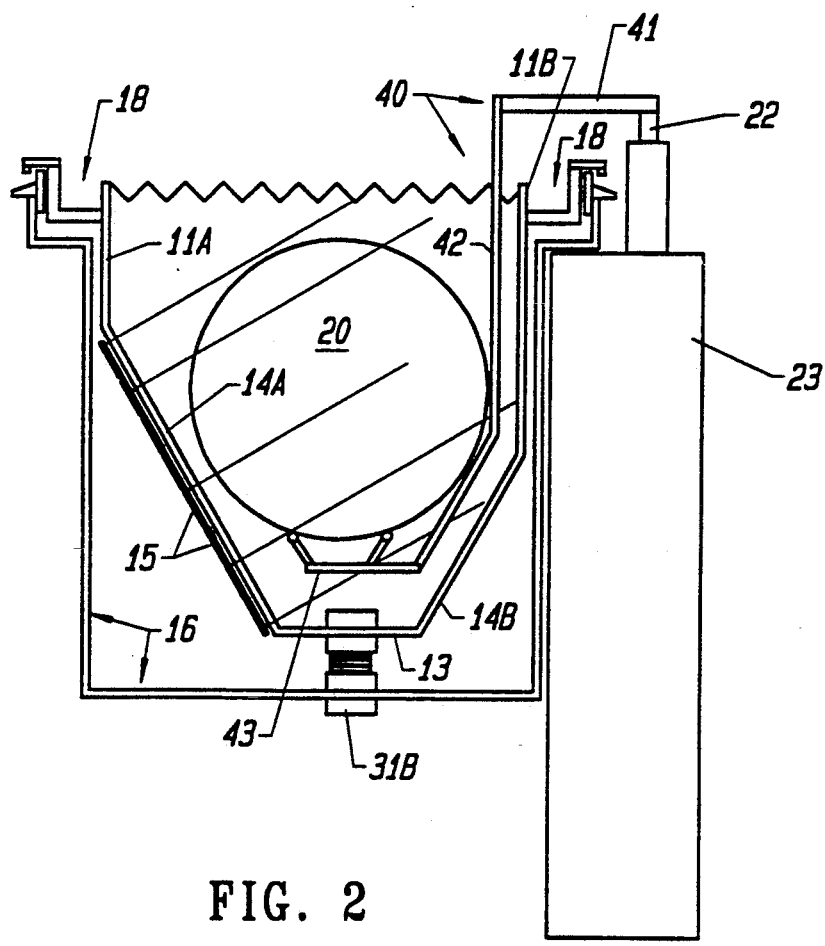
FIG. 2 is a cross-sectional side view of the bath system of FIG. 1.
Figure 3:
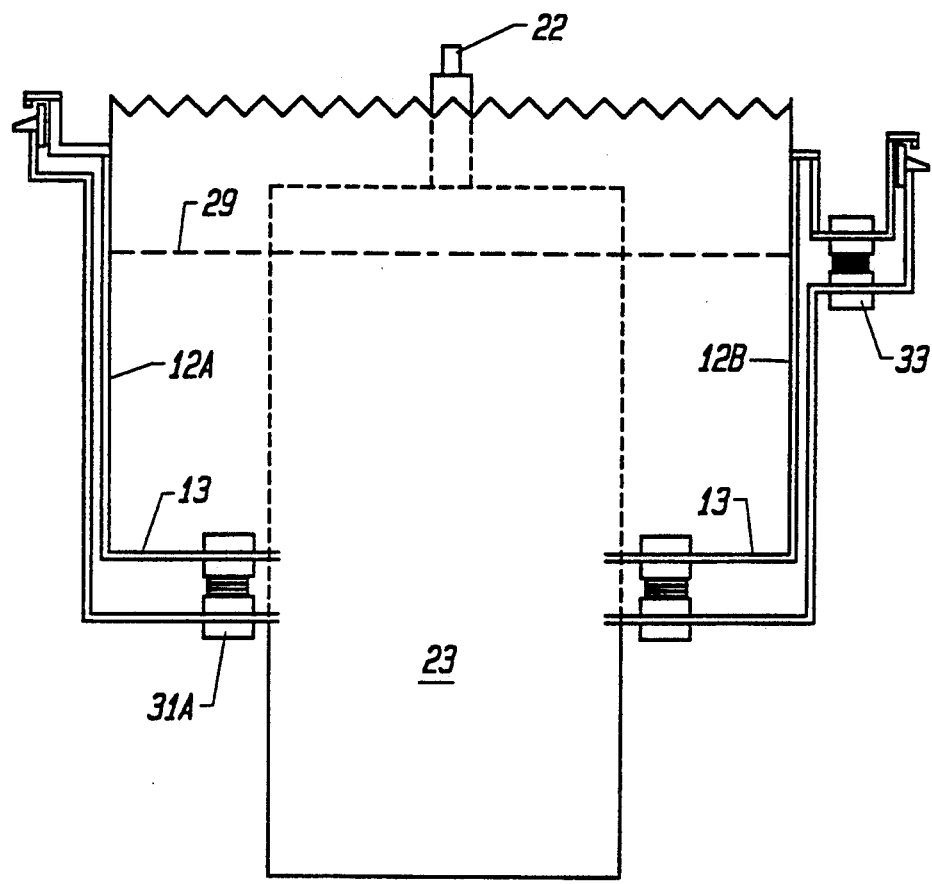
FIG. 3 is another cross-sectional view of the bath system of FIG. 1.

The container 10 is formed by a bottom wall 13, end walls 12A and 12B, vertical side walls 11A and 11B, and oblique walls 14A and 14B. The side wall 11A and oblique wall 14A are fused together at a 30° angle at a horizontal joint represented by a dotted line 29. The walls 11A and 14A are fused to the end walls 12A and 12B. In a similar fashion, the oblique wall 14B is fused to the side wall 11B at a 30° angle; both are fused to the end walls 12A and 12B. The side wall 11B and oblique wall 14B are shown in FIG. 2.

Sonic transducers 15 are attached to the oblique wall 14A on the outside of the container 10. The oblique wall 14A makes a 30° angle with respect to the side wall 11A. The sonic energy which is generated by the transducers 15 travels through the oblique wall 14A perpendicularly to the wall 14A in the processing liquid in the container 10. The obliqueness of the wall 14A allows the sonic waves to travel across the front and back surfaces of the semiconductor wafers 20, strike the side wall 11B and oblique wall 14B, and reflect from these walls 11B and 14B towards the top of the container 10. The sonic waves are reflected away from the sources of the sonic energy, the transducers 15, to avoid standing waves of sonic energy and dead spots across the wafer surfaces.

For processing, the wafers 20 are individually placed in a wafer holding assembly 40 which has a receptor portion 43 which holds wafers 20. A wafer cassette is not used as in many present systems. This reduces contamination and increases processing yields. The receptor portion 43 is connected, in turn, to a vertical arm 42 which is connected to a horizontal arm 41 at one end. The other end of the arm 41 is connected to a piston 22 which is part of a robot control 23 illustrated by a rectangular housing. Under external signals, the control 23 drives the piston 22 up to raise the wafers 20 up and out of the processing container 10, and down to lower the wafers 20 into the container 10. The control 23, a standard microprocessor-based control system, also operates the flow of liquid and gas into and from the container 10.

Figure 4A:
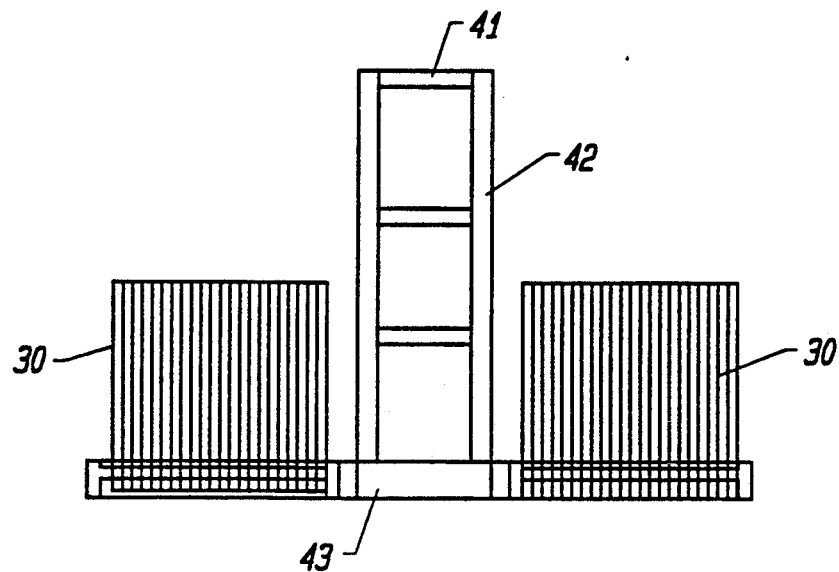
FIG. 4A illustrates a side view of the wafer holder assembly of the bath system of FIG. 1.
Figure 4B:
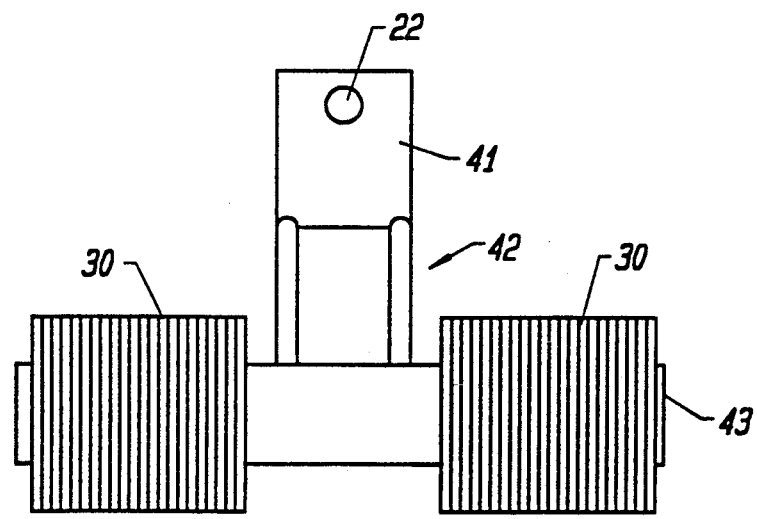
FIG. 4B illustrates a top view of the wafer holder assembly of FIG. 4A.

FIGS. 4A and 4B show the wafer holding assembly 40 in more detail. The wafer receptor portion 43 of the assembly 40 has parallel grooves so that the wafers 20 are spaced apart slightly and held upright. As shown in FIG. 2, each groove has three points upon which an inserted wafer 20 rests. The wafers 20 are arranged in a cylinder, with each wafer 20 forming a right cross-sectional portion of the cylinder. As shown in FIGS. 4A and 4B, the wafers 20 are divided into two groups by a center of the wafer where the vertical arm 42 joins. When the wafers 20 are lowered in place, the two groups of wafers 20 are located substantially above the gas distribution manifolds 32A and 32B. The center axis of the cylindrical arrangement is aligned with the long axis of the gas manifolds 32A and 32B to permit a process gas to bubble through the wafers. The wafers 20 are exposed optimally to the chemistry created by the introduced gas.

Returning to the sonic transducers 15, it should be noted that the transducers 15 are attached to the outside surface of the quartz wall 14A with special care. To properly bond the ceramic transducers 15 to the quartz wall 14A, a bonding element which has sufficient hardness when set to effectively transmit the sonic energy from the transducers 15 and a suitable coefficient of expansion over the range of processing temperatures with respect to the ceramic transducer and the quartz wall should be used. One such bonding agent is "Devcon 2-Ton Epoxy", sold by Devcon, Inc. of Danvers, Mass. which has been found to be effective up to 90° C. without failure.

Additionally, the quartz wall 14A to which the transducers are bonded is machined to set the thickness of the wall to a desired value. By thus setting the wall thickness, sonic energy passes through the wall rather than be reflected. Such a maximum transmission of energy occurs if the thickness of the wall, or a portion of the wall on which the transducer is mounted, is:

$$d = \frac{n\lambda_f}{4} \text{ where } n = 1, 3, 5 \ldots \text{(odd number)} \quad (1)$$

where d is the thickness of the wall, and $\lambda$ is the wavelength of the sonic energy in the wall material, here, quartz, at the frequency f. Thus, for the transducers 15 being driven at 650–850 KHz, it has been found that a thickness of 0.1875 inches for the quartz wall 14A efficiently transmits the energy into the processing liquid in the container 10. Of course, different wall thicknesses may be used for different frequencies.

The bath system according to the present invention has several advances over present bath systems. Heretofore, semiconductor wafer baths solved the problem of standing waves by placing the sonic transducers at the bottom of the processing container. The sonic waves were directed upwards to the surface of the processing liquid. The present invention places the transducers 15 away from the bottom of the container. Sonic energy is directed from the side towards the wafers without any interference from the gas dispersion manifolds 32A and 32B and without standing waves. Since the manifolds 32A and 32B are not constrained by the transducers 15, the size, placement and shape of the manifolds may be freely selected on the bottom wall 13 for the optimum dispersion of gas into the liquid. Gas dispersion, chemical change, and ultimately processing times are hastened.

Another advance of the bath system according to the present invention is a significant reduction in the volume of liquid required to fill the container 10. With the first and second oblique walls 14A and 14B, the container 10 requires only 27 liters of liquid. In contrast, present containers, which are rectangularly shaped, require some 51 liters to handle the same number of wafers, in this case, 50 8-inch wafers. Not only is a cost savings achieved in the reduction of liquid, but processing time is lowered. With a smaller amount of liquid in the container 10, a change in the chemistry of the liquid may be effected much more quickly.

Finally, though a general system of automated wafer fabrication is beyond the scope of the present invention, it should be noted that present bath system fits well into such a system. Under operation of the bath system's robot control 23 which is in communication with an overall system control, wafers can be loaded unto the wafer holding assembly 40, sequentially processed in the container 10 by selected liquids and gases, and unloaded from the assembly 40 for transfer to the next processing station.

While the invention has been particularly shown and described with reference the preferred embodiments, it is understood by those skilled in the art that changes in form and details may be made without departing from the spirit of this invention. It is therefore intended that an exclusive right be granted to the invention as limited only by the metes and bounds of the appended claims.

What is claimed is:

1. A bath system for processing semiconductor wafers comprising
   a container for receiving at least one semiconductor wafer and for holding liquid for processing said wafer, said container having two vertical end walls, two side walls and a bottom wall, each of said side walls including a top vertical wall portion and a bottom wall portion which forms an oblique angle with respect to said top wall portion, one of said bottom wall portions being larger than the other of said bottom wall portions,
   means for generating sonic energy attached to the larger of said bottom wall portions outside of said liquid for directing sonic energy through said wall portion and said liquid to said wafer,
   inlet means for liquid and gas mounted on said bottom wall;
   whereby liquid and gas may be introduced into said container from the bottom and sonic energy may directed toward said wafer during processing with sonic waves reflected away from said means for generating sonic energy to avoid standing waves and dead spots across the surface of said wafer.

2. The bath system as in claim 1 wherein said inlet means is located on said bottom wall.

3. The bath system as in claim 2 further comprising means for holding a plurality of said wafers in said container, said wafers aligned in a horizontal cylindrical arrangement with a center axis through the center of each aligned wafer and wherein said inlet means is located substantially below said center axis.

4. The bath system as in claim 3 wherein said inlet means comprises a first inlet means for liquid and a second inlet means for gas.

5. The bath system as in claim 4 wherein said first inlet means is located substantially in the middle of said horizontal arrangement of wafers below said center axis and said second inlet means comprises two gas inlets located substantially below said center axis on either side of said first inlet means.

6. The bath system as in claim 5 wherein said second inlet means comprises a gas manifold for each of said gas inlets to disperse the introduction of gas into liquid in said container.

7. The bath system as in claim 1 wherein one oblique angle is approximately 30°.

* * * * *